US010913011B2

(12) United States Patent
Diaz et al.

(10) Patent No.: US 10,913,011 B2
(45) Date of Patent: Feb. 9, 2021

(54) METHOD AND SYSTEM FOR DEMULSIFIER TESTING

(71) Applicants: Carlos Diaz, Houston, TX (US); Tomasa Ledesma, Houston, TX (US); Bruce Oyer Horne, Sugar Land, TX (US); Carla Cecilia Perla, Houston, TX (US); Leonardo Mega Franca, Sugar Land, TX (US); James Scarborough, Houston, TX (US); Eric Willmott, Houston, TX (US)

(72) Inventors: Carlos Diaz, Houston, TX (US); Tomasa Ledesma, Houston, TX (US); Bruce Oyer Horne, Sugar Land, TX (US); Carla Cecilia Perla, Houston, TX (US); Leonardo Mega Franca, Sugar Land, TX (US); James Scarborough, Houston, TX (US); Eric Willmott, Houston, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 0 days.

(21) Appl. No.: 16/511,734

(22) Filed: Jul. 15, 2019

(65) Prior Publication Data
US 2020/0016513 A1 Jan. 16, 2020

Related U.S. Application Data

(60) Provisional application No. 62/697,446, filed on Jul. 13, 2018.

(51) Int. Cl.
*B01D 15/38* (2006.01)
*B04B 1/04* (2006.01)
(Continued)

(52) U.S. Cl.
CPC ............ *B01D 15/3871* (2013.01); *B04B 1/04* (2013.01); *H05K 7/207* (2013.01); *F21S 8/024* (2013.01)

(58) Field of Classification Search
None
See application file for complete search history.

(56) References Cited

U.S. PATENT DOCUMENTS 7,045,358 B2   5/2006   Chandler, Jr.
8,888,362 B2   11/2014  Hart et al.
(Continued)

OTHER PUBLICATIONS

International Search Report for International Application No. PCT/US2019/041301, International Filing Date Jul. 11, 2019, dated Oct. 30, 2019, 3 pages.
(Continued)

*Primary Examiner* — Richard C Gurtowski
(74) *Attorney, Agent, or Firm* — Cantor Colburn LLP

(57) ABSTRACT

A system for monitoring phase separation is disclosed. The system includes a temperature control housing having an inlet and an outlet connection for a circulator; a bottle holder positioned inside the housing, the bottle holder having a body with a plurality of recesses for receiving test bottles, each recess having a back surface, a front opening, and a first light scanning component mounted on the back surface of the recess; a sleeve having a plurality of second light scanning components mounted thereon, the sleeve being disposed between the housing and the bottle holder, and each second light scanning component being aligned with one of the first light scanning components; and a lid latched onto the housing to hold the test bottles in place during testing.

19 Claims, 16 Drawing Sheets

(51) Int. Cl.
*H05K 7/20* (2006.01)
*F21S 8/02* (2006.01)

(56) References Cited

U.S. PATENT DOCUMENTS

| | | |
|---|---|---|
| 2002/0106813 A1 | 8/2002 | Smith et al. |
| 2004/0013575 A1 | 1/2004 | Stevens et al. |
| 2007/0173397 A1* | 7/2007 | Hinman .................. B04B 1/04 494/1 |
| 2007/0297279 A1 | 12/2007 | Gao et al. |
| 2012/0021452 A1* | 1/2012 | Bishop .................. B01F 9/003 435/29 |
| 2012/0024724 A1* | 2/2012 | Beardsall ............... A61B 50/36 206/205 |
| 2012/0140058 A1 | 6/2012 | McDaniel et al. |
| 2013/0164789 A1* | 6/2013 | Schultz ................ B01F 3/0807 435/91.2 |

OTHER PUBLICATIONS

Written Opinion for International Application No. PCT/US2019/041301, International Filing Date Jul. 11, 2019, dated Oct. 30, 2019, 6 pages.

* cited by examiner

METHOD AND SYSTEM FOR DEMULSIFIER TESTING

CROSS REFERENCE TO RELATED APPLICATIONS

This application claims the benefit of U.S. Provisional Application Ser. No. 62/697,446, filed Jul. 13, 2018, the disclosure of which is incorporated herein by reference in its entirety.

BACKGROUND

Demulsifiers are a class of chemicals used to separate oil and water emulsions. To select a suitable demulsifier for a given emulsion, standard procedure is to conduct a bottle test. Bottle tests involve adding varying amounts of demulsifiers to a series of bottles containing the sample of an emulsion to be broken, shaking the test bottles, and monitoring the rate of oil-water separation as a function of time. The current in-field bottle testing methods are time consuming, and the data collected can vary greatly depending on the experience level of an operator. Accordingly, there is a need in the art for automated systems that are effective to provide real-time digital data to evaluate demulsifier performance.

SUMMARY

A system for monitoring phase separation is disclosed. The system includes a temperature control housing having an inlet and an outlet connection for a circulator; a bottle holder positioned inside the housing, the bottle holder having a body with a plurality of recesses for receiving test bottles, each recess having a back surface, a front opening, and a first light scanning component mounted on the back surface of the recess; a sleeve having a plurality of second light scanning components mounted thereon, the sleeve being disposed between the housing and the bottle holder, and each second light scanning component being aligned with one of the first light scanning components; and a lid latched onto the housing to hold the test bottles in place during testing.

A method of evaluating demulsifiers for breaking an emulsion using the above described system is disclosed. The method comprises: disposing test bottles in the recesses of the bottle holder, the test bottles containing a control emulsion or a test emulsion, the test emulsion including an emulsion to be broken and a demulsifier; and recording oil/water separation information using the first or second scanning component.

BRIEF DESCRIPTION OF THE DRAWINGS

The following descriptions should not be considered limiting in any way. With reference to the accompanying drawings, like elements are numbered alike.

DETAILED DESCRIPTION

A system is disclosed that uses light scanning technology to measure water drop and interface quality during in-field demulsifier testing. The system is lightweight, durable, and the temperature of the system can be controlled to best mimic site-specific oilfield conditions. The new system can be an automated system that makes field testing much easier. In addition, the system provides real-time reliable digital data that can be easily analyzed and communicated.

Figure 1:
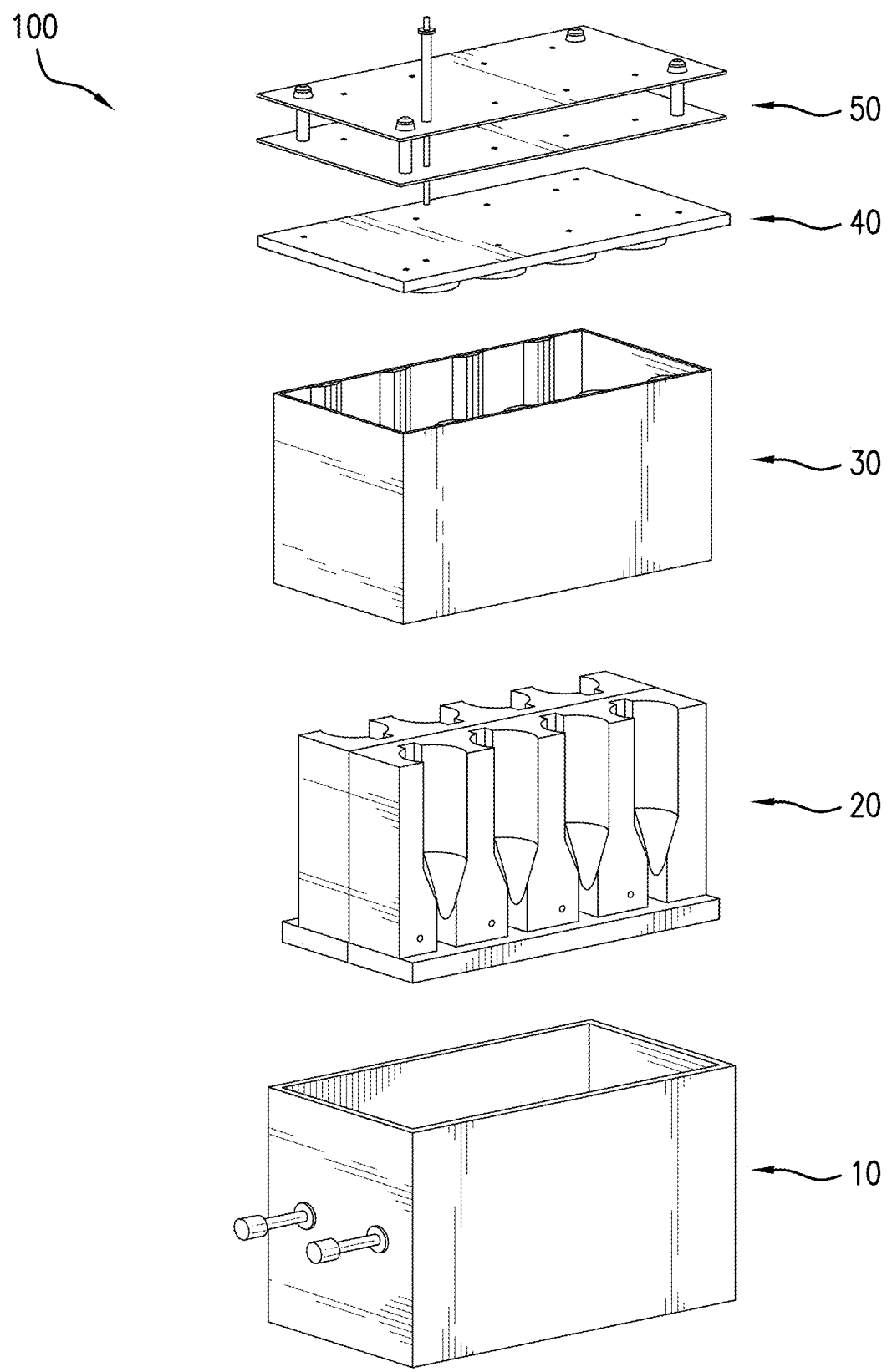
FIG. 1 is an exploded view of an exemplary system for evaluating phase separation.

An exemplary system for evaluating phase separation is shown in FIG. 1. The system (100) includes a housing (10) for temperature control, a bottle holder (20) for receiving test bottles, a sleeve (30) that carries a scanning component, a secure lid (40) with cannula holes and extraction unit mounts, and an extraction unit (50) for quick and consistent sample extraction.

Figure 2:
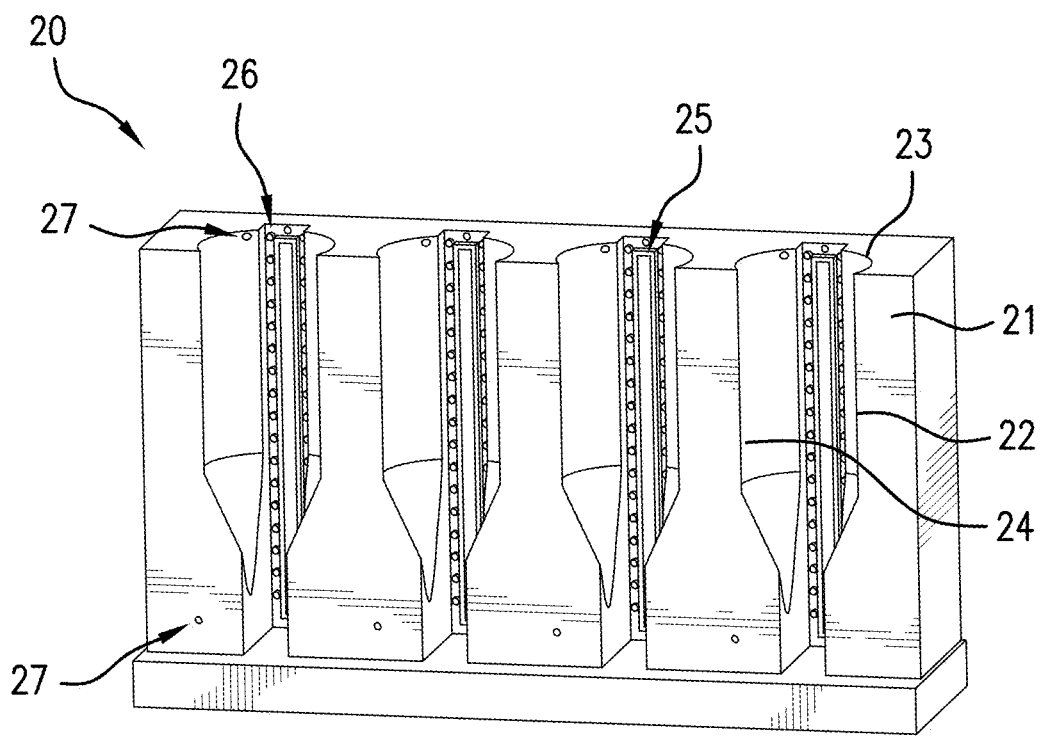
FIG. 2 is a cross-sectional view of a portion of an exemplary bottle holder according to an embodiment of the disclosure.

As shown in FIG. 2, the bottle holder (20), which is portable, has a body (21) with a plurality of recesses (22) that can receive test bottles (29). Each recess (22) has a back surface (23) and a front opening (24). The back surface (23) can have a first scanning component (25) disposed thereon.

Exemplary scanning components include light emitters or transmission processors such as a Lume/Turbiscan instrument reader, where the light emitters and the transmission processors together can be configured to provide phase separation information (automated digital data) for the samples in the test bottles based on light scanning technology. The recesses (22) can also have light-emitting diode (LED) backlights (26) to allow for manual reading. The bottle holder (20) can also have holes (27) for wiring.

Figure 3:
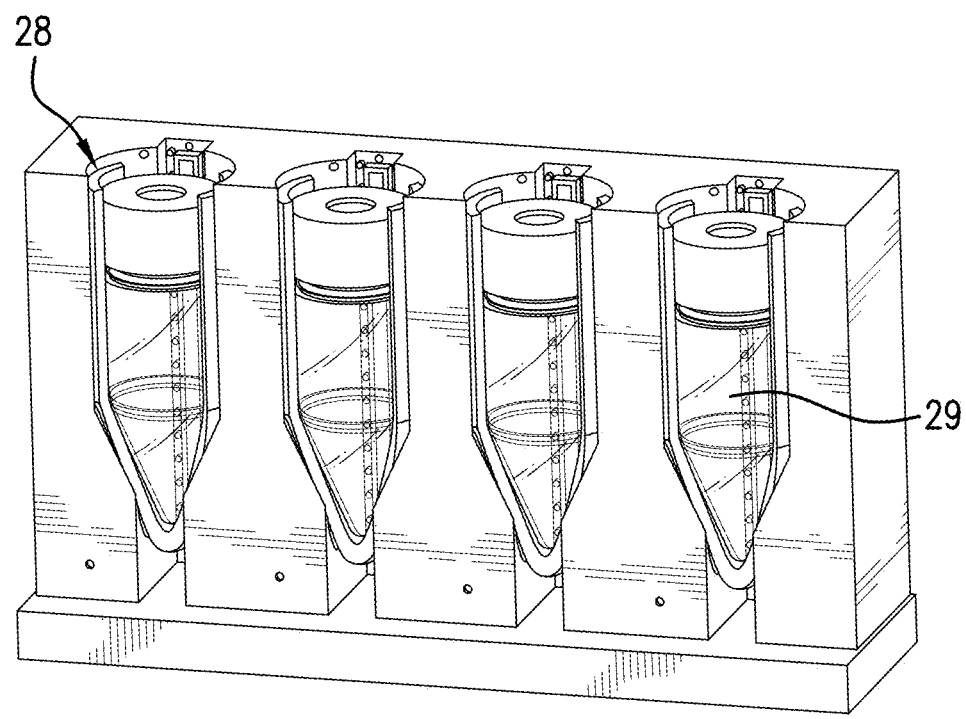
FIG. 3 is a cross-section view of a portion of an exemplary bottle holder according to another embodiment of the disclosure.

In an embodiment, each recess (22) has a heating mantle liner (28) disposed therein to provide elevated temperature control as shown in FIG. 3. Each test bottle (29) is rested on the heating mantle during use.

Figure 4:
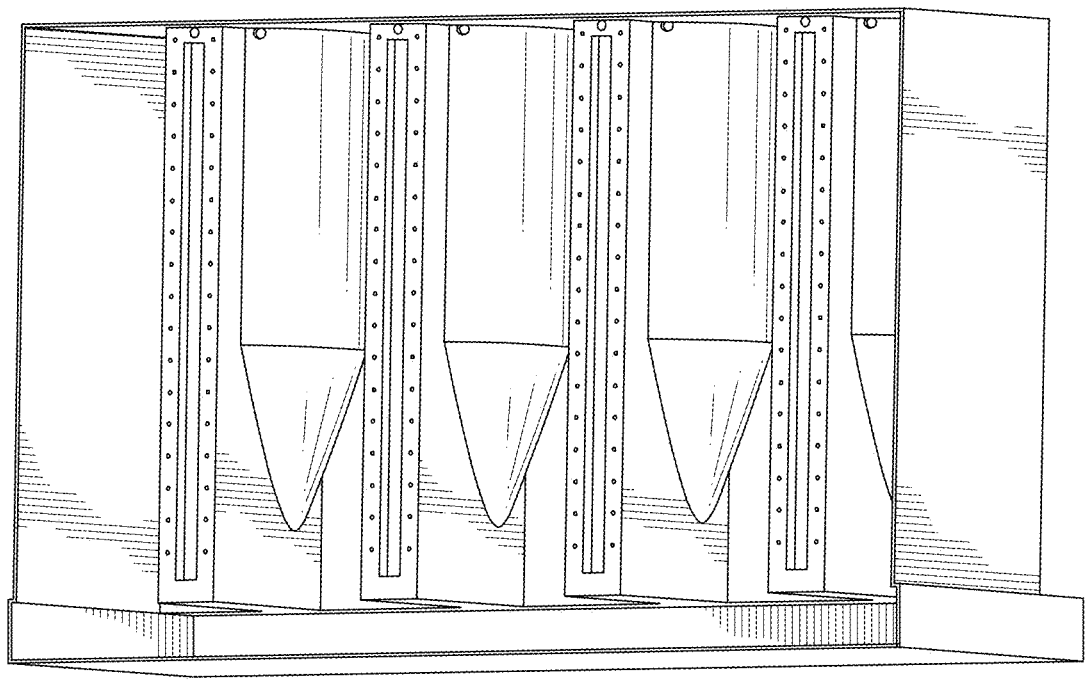
FIG. 4 shows the interior of an exemplary bottle holder.

As illustrated in FIG. 4, the interior of the bottle holder can be hollow to maintain a lightweight system. The hollow interior also allows for easy access when maintenance is required.

Figure 5:
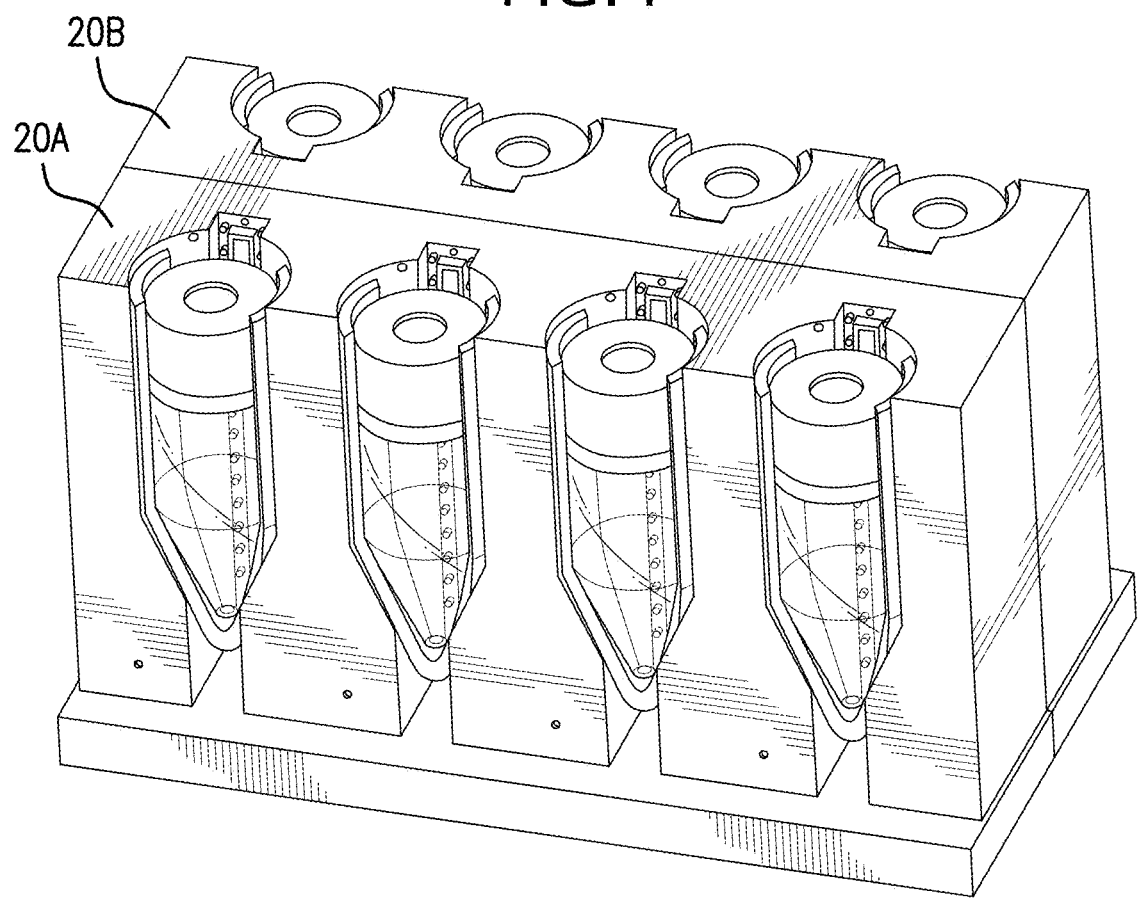
FIG. 5 illustrates a bottle holder having two units.
Figure 6:
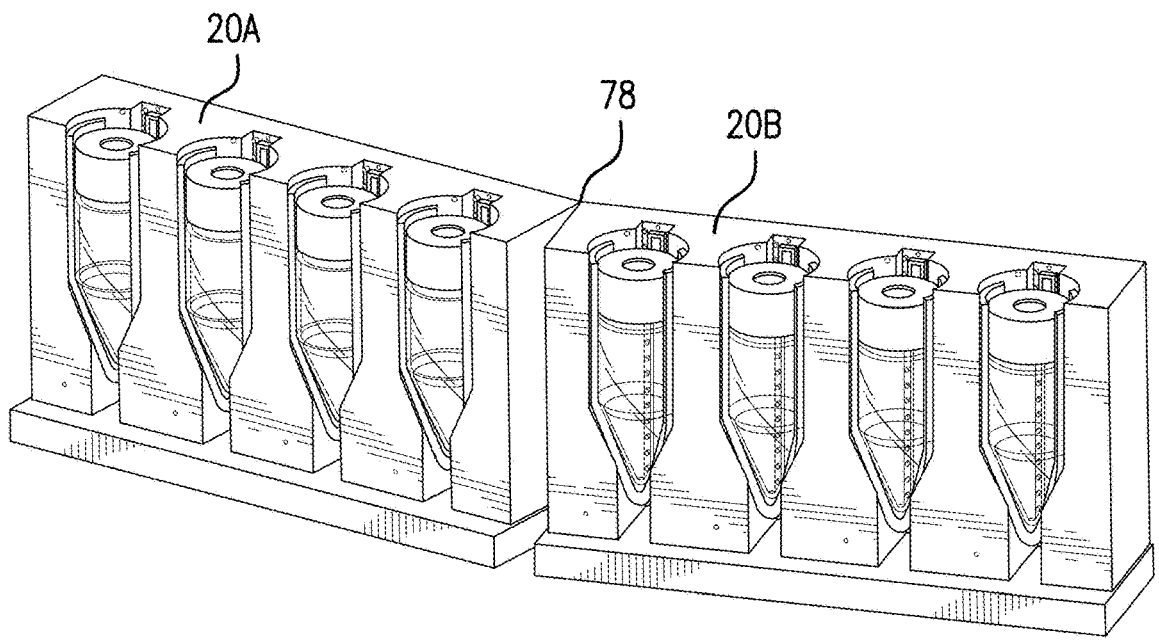
FIG. 6 shows a bottle holder having two units hinged together.

The bottle holder (20) can be split into two identical parts (20A, 20B), connected via a hinge (78) as shown in FIGS. 5 and 6. The bottle holder according to this embodiment is easy to handle and maintain. In addition, all the tested samples can be posed for pictures at the same time.

Figure 7:
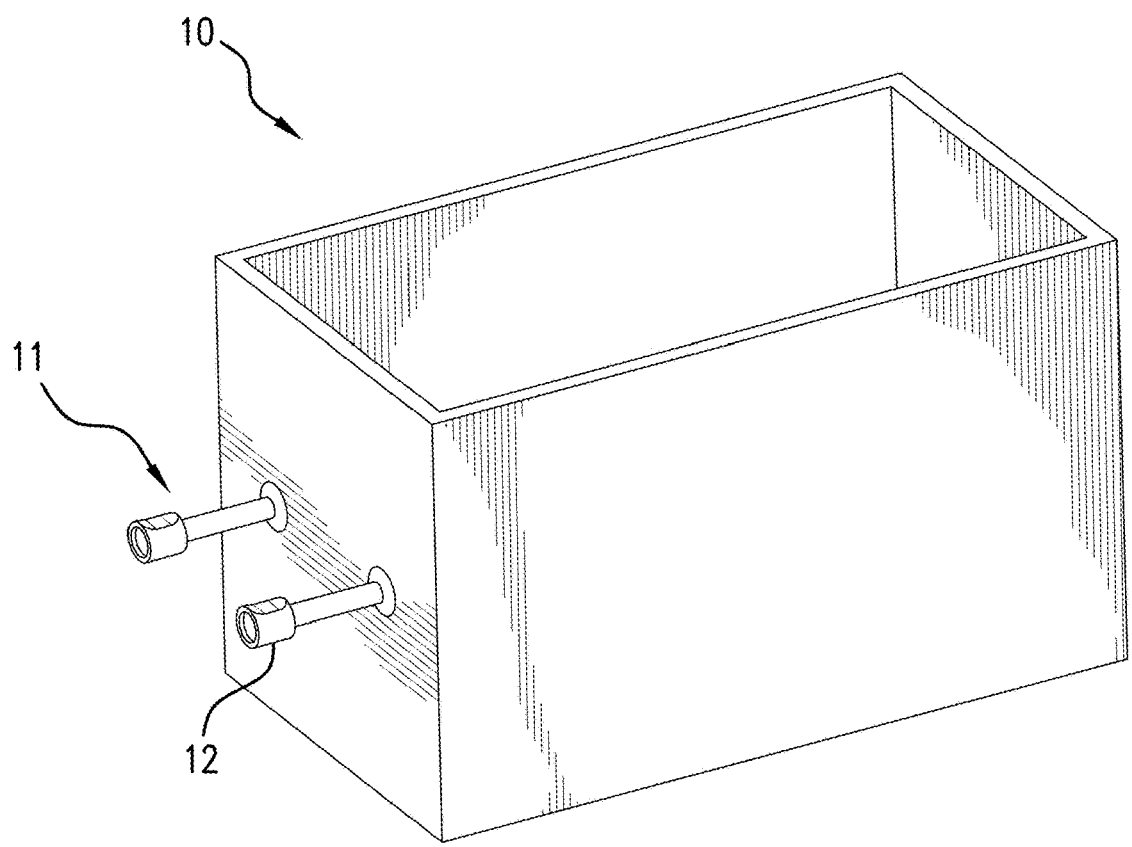
FIG. 7 shows a housing having an inlet and an outlet.
Figure 8:
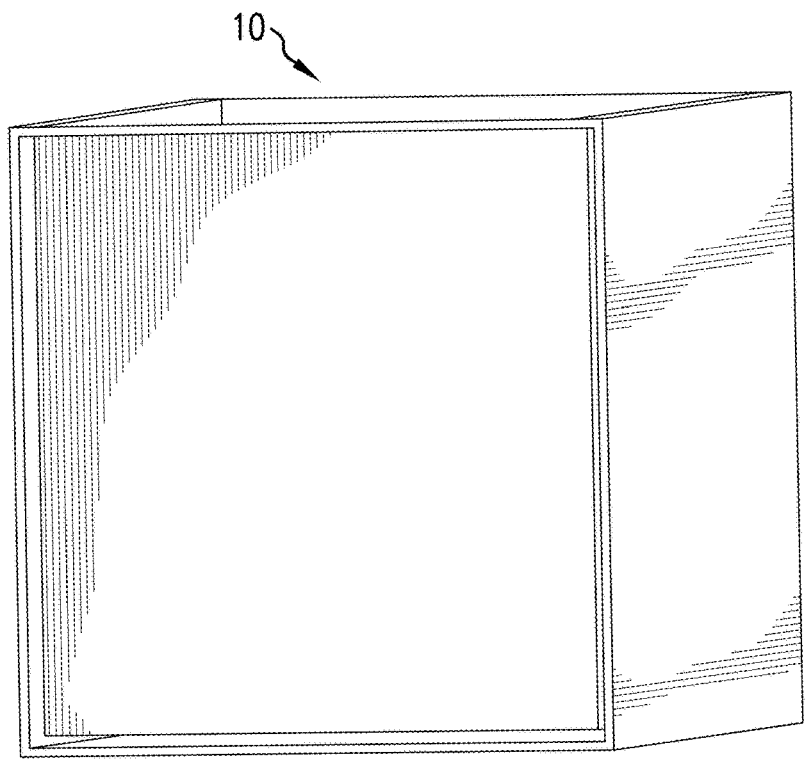
FIG. 8 shows a housing having a hollow shell.

An example of housing (10) is shown in FIGS. 7 and 8. The housing can be hollow to allow it to be filled with a temperature control fluid, while keeping the entire system lightweight. The housing has an inlet (11) and an outlet (12) and can be connected to a circulator and/or other units (not shown). The circulator can flow hot or cold fluid through the housing to assist in maintaining elevated temperatures, as well as cooling the test samples when evaluating cooler fields and production systems. The housing can also be connected to other systems, allowing field tests to be completed with only one circulator.

Figure 9:
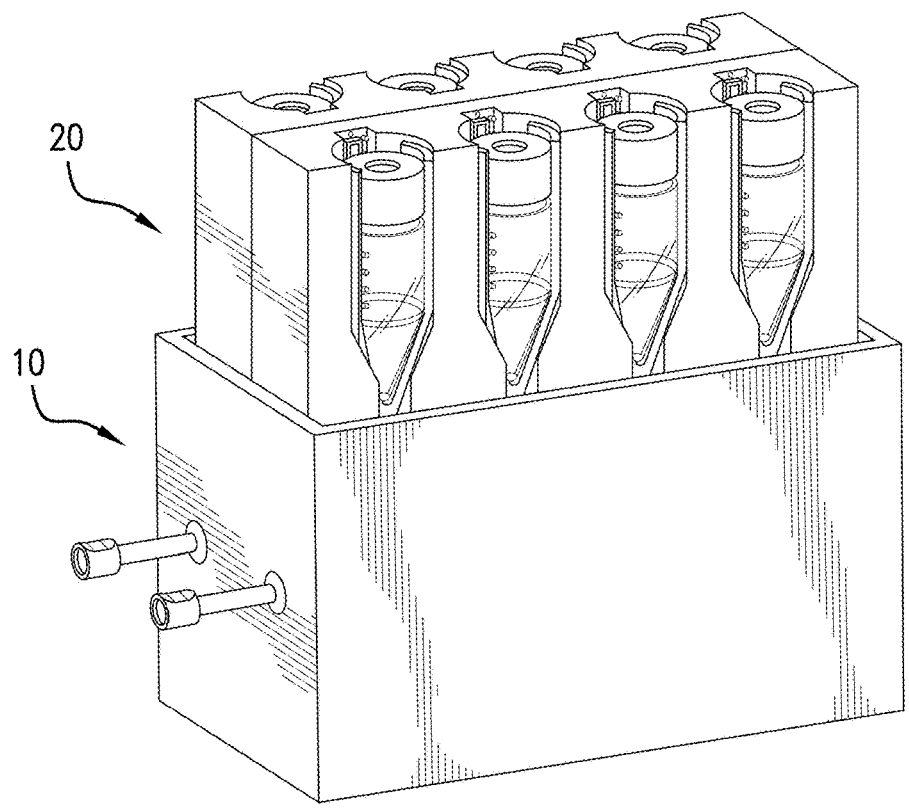
FIG. 9 illustrates a process of placing a bottle holder in a housing.
Figure 10:
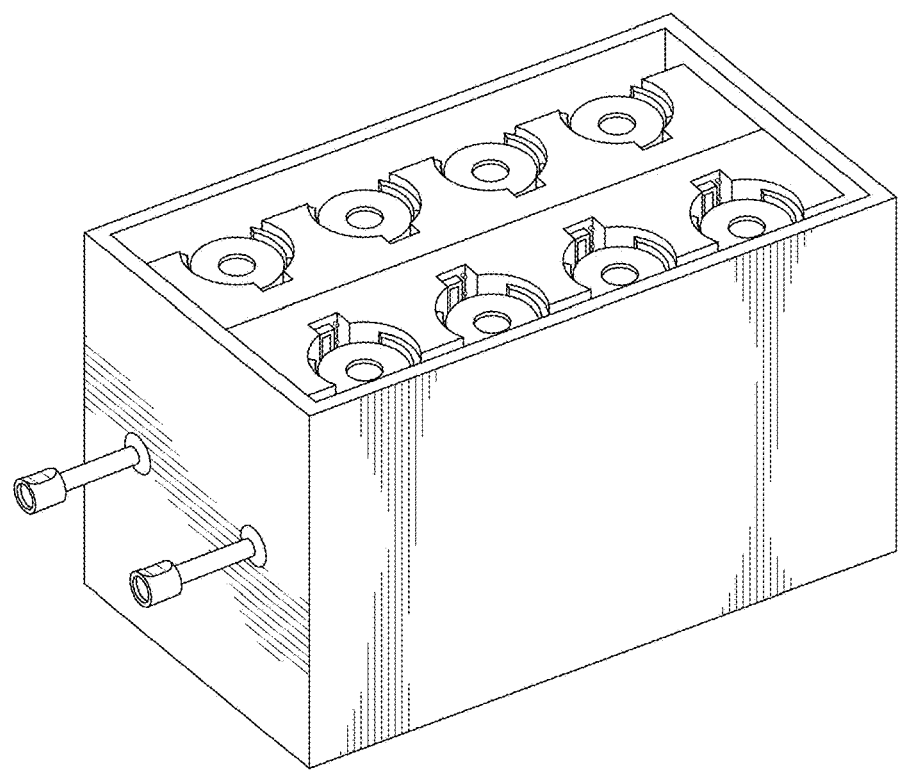
FIG. 10 shows a housing having a bottle holder seated therein.

The bottle holder (20) can be placed in the housing (10) as shown in FIG. 9. FIG. 10 shows a housing having a bottle holder seated therein.

Figure 11:
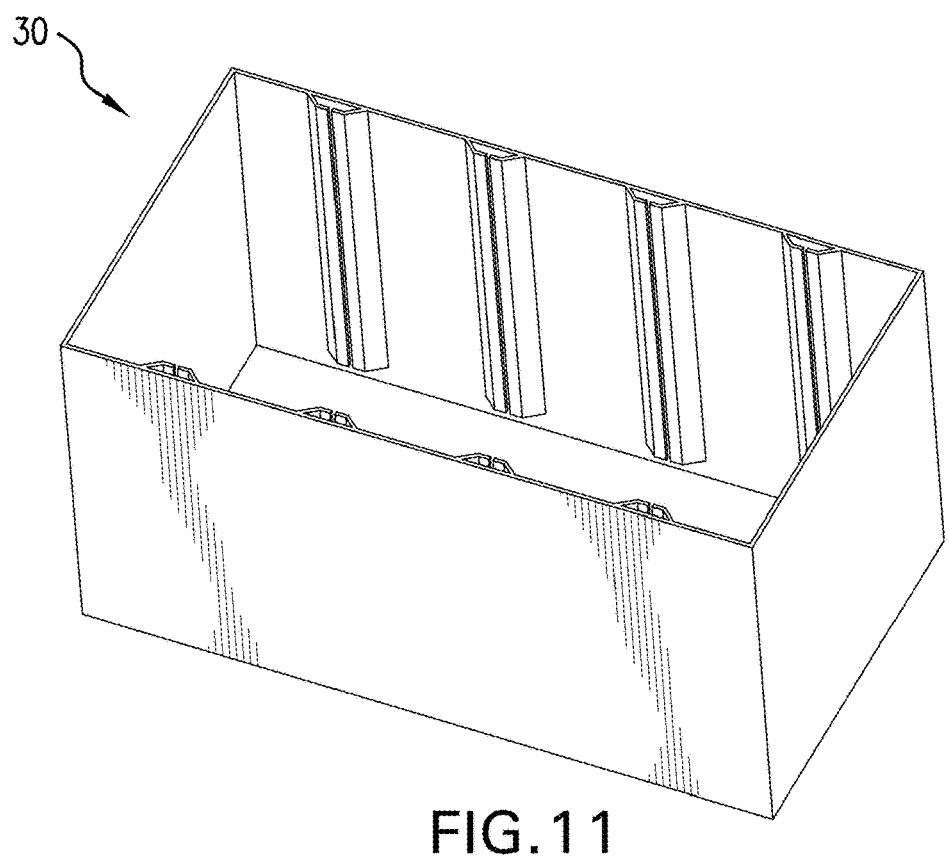
FIG. 11 shows a sleeve having a plurality of grooves.
Figure 12:
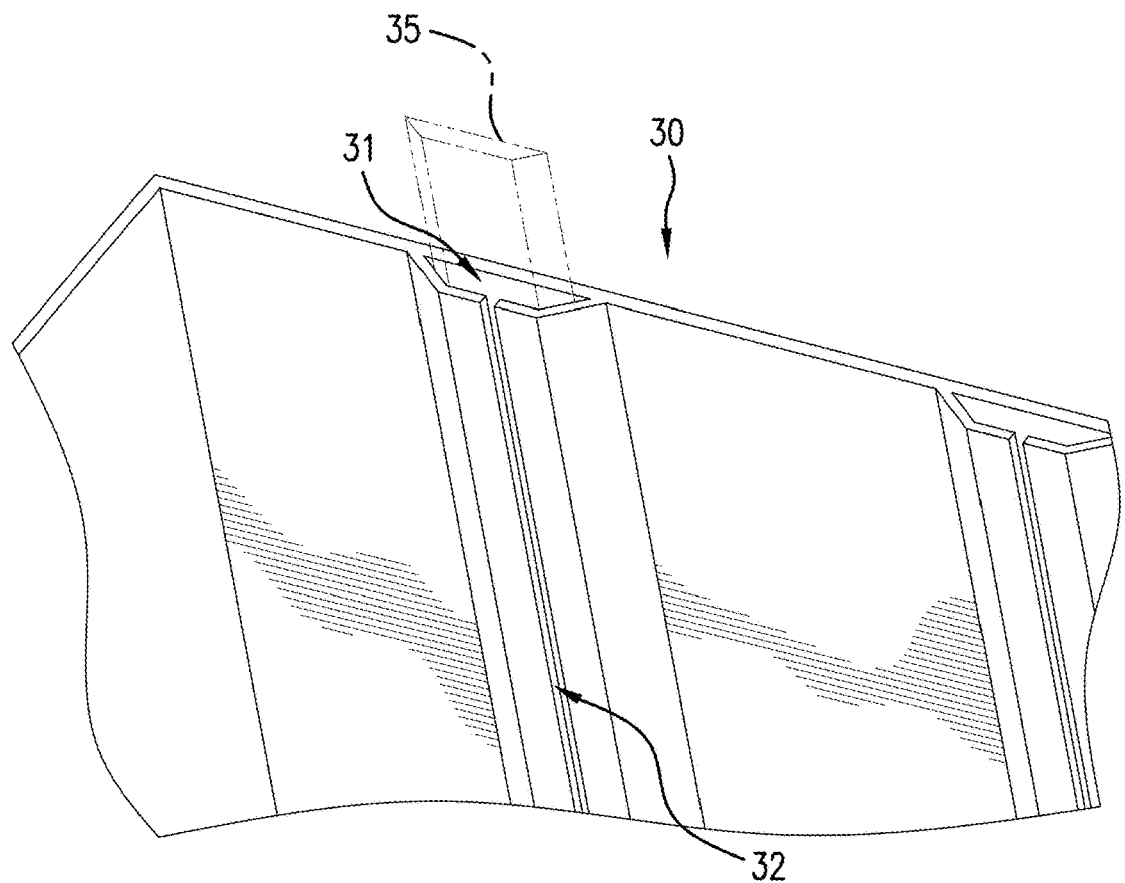
FIG. 12 is another view of a portion of the sleeve of FIG.
Figure 13:
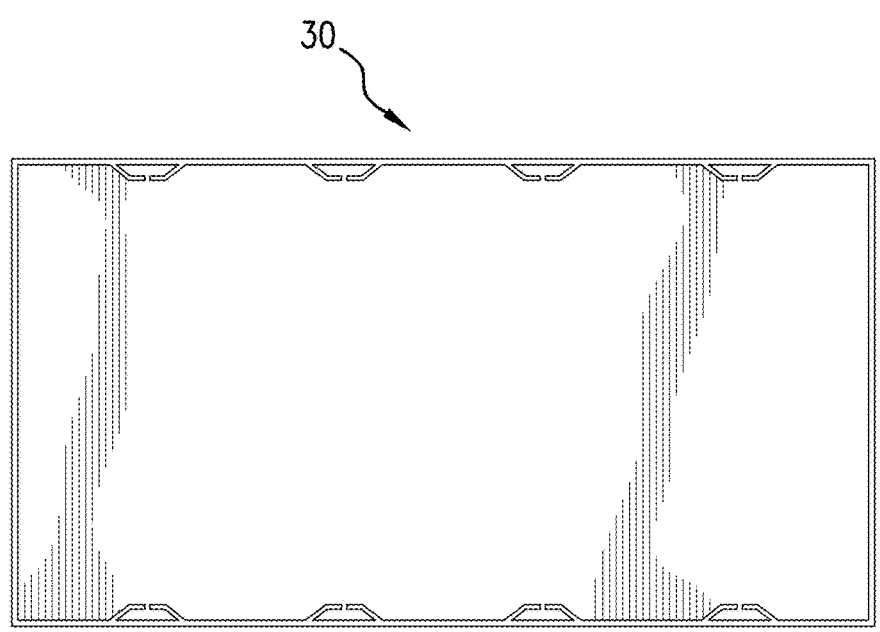
FIG. 13 is a top view of the sleeve of FIG. 11.
Figure 14:
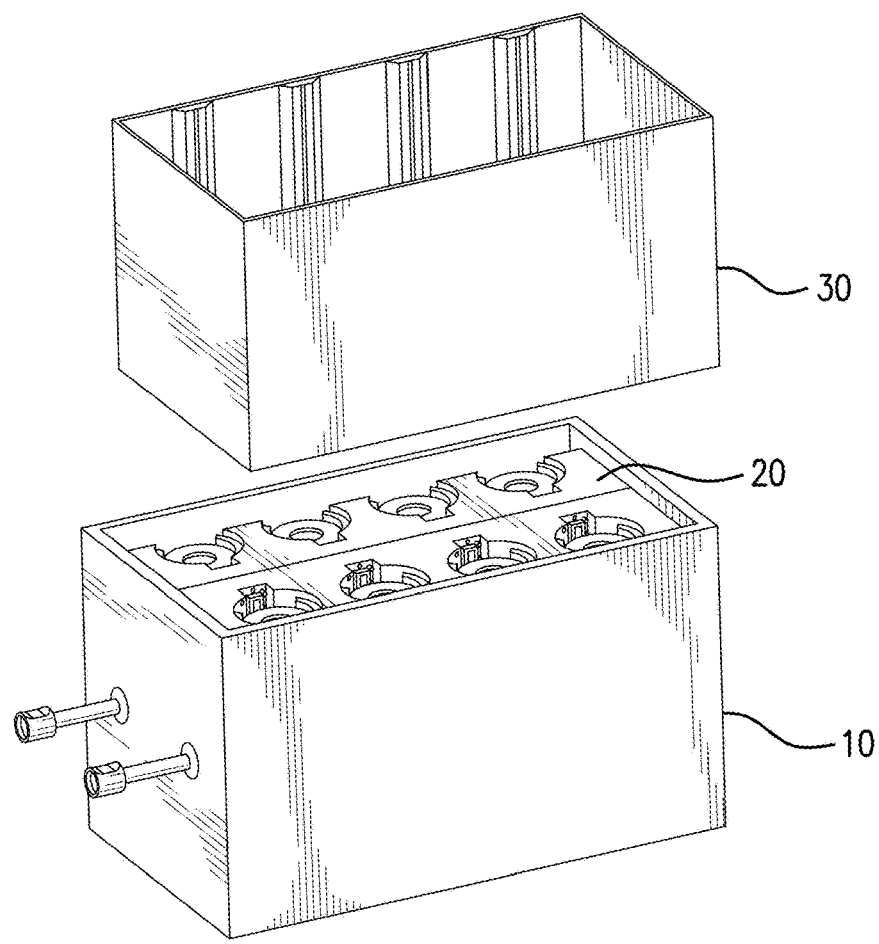
FIG. 14 illustrates a process of inserting a sleeve between a bottle holder and a housing.
Figure 15:
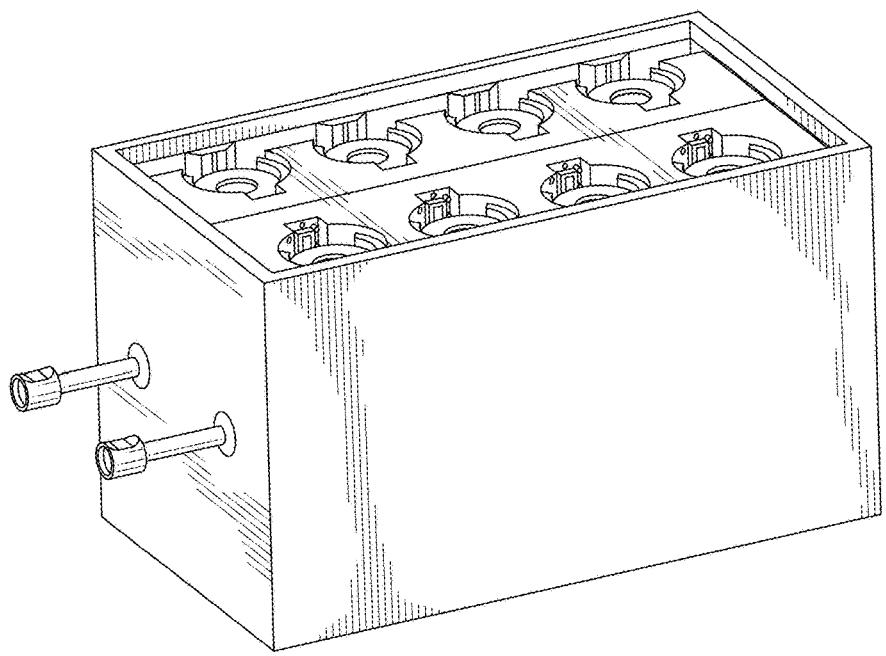
FIG. 15 shows a system having a bottle holder, a housing, and a sleeve inserted therebetween.
Figure 16:
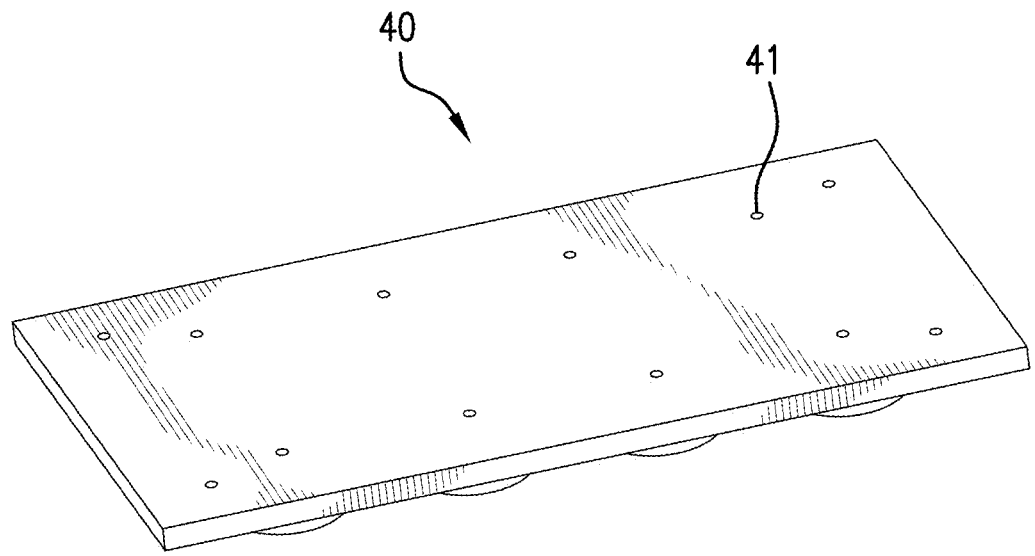
FIG. 16 illustrates an exemplary lid.
Figure 17:
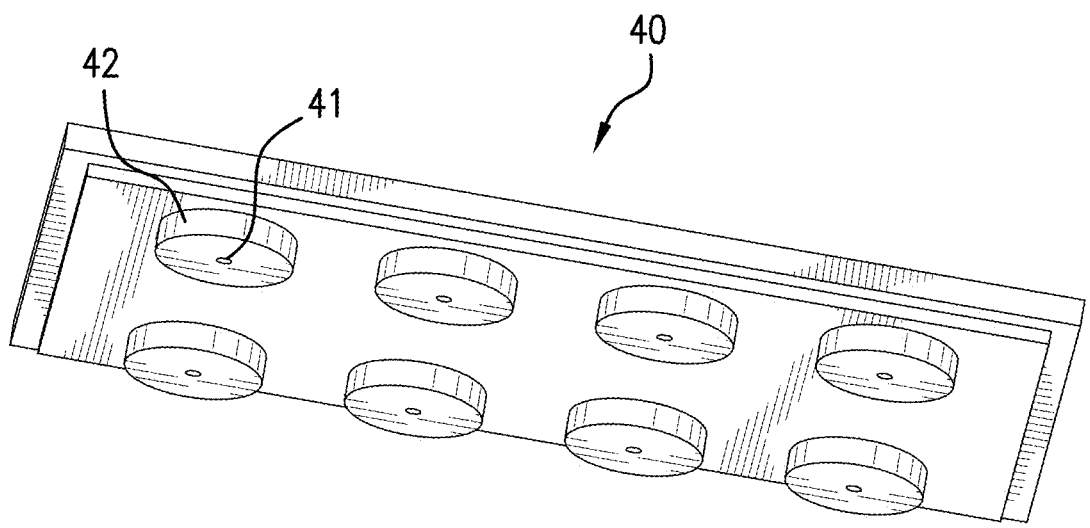
FIG. 17 shows an exemplary lid having cushioning pads.
Figure 18:
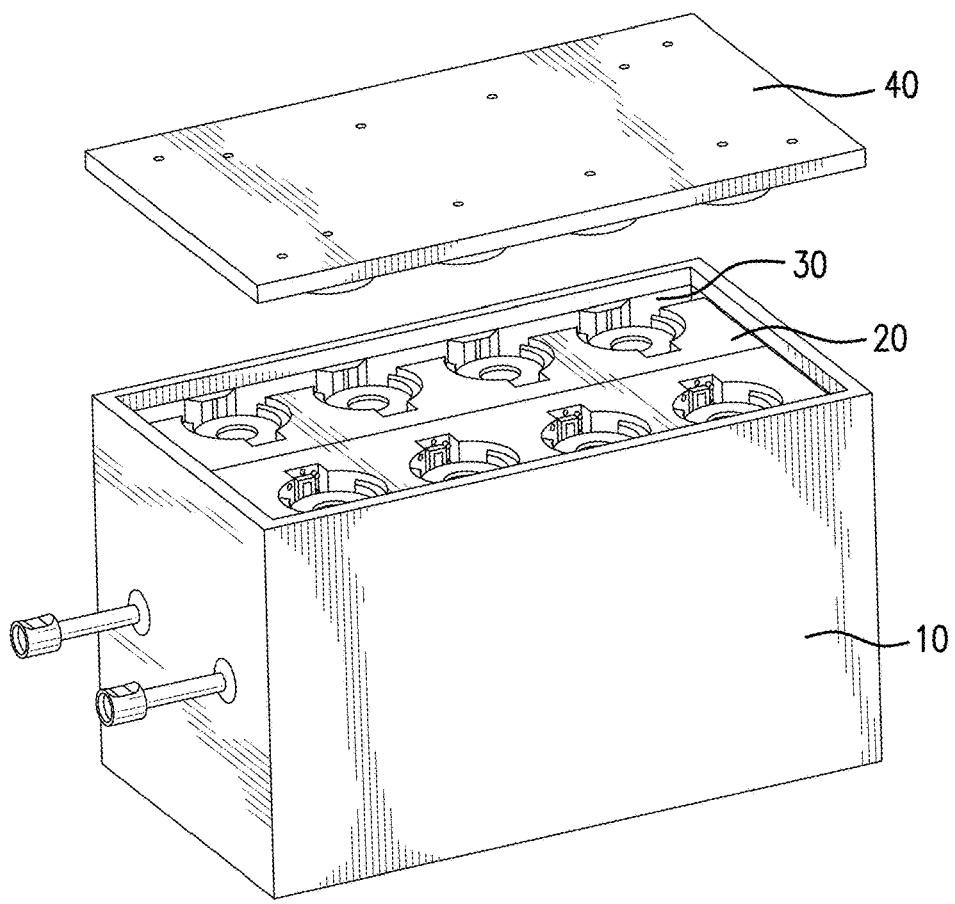
FIG. 18 illustrates a process of disposing the lid on a housing.
Figure 19:
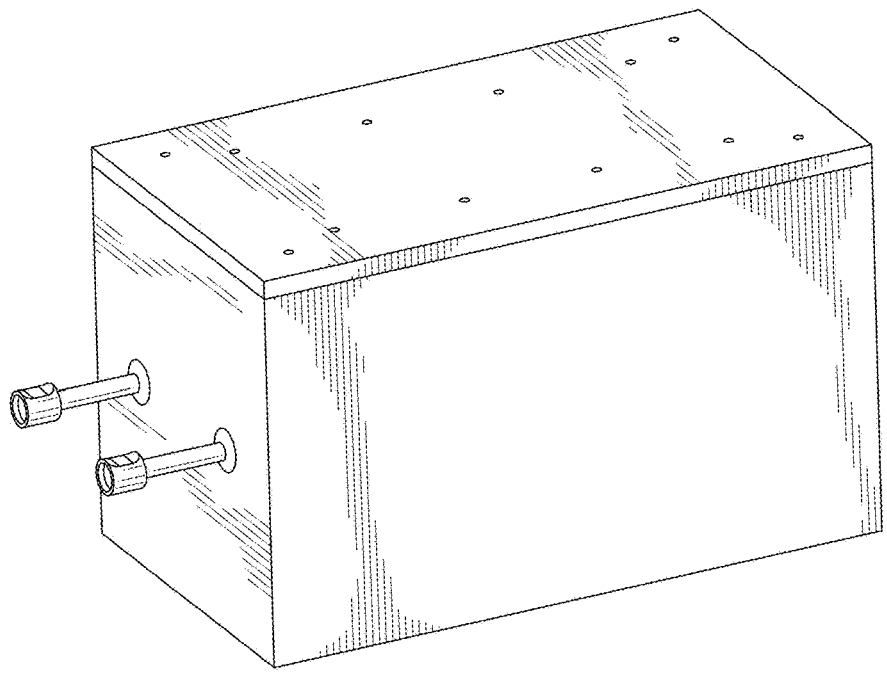
FIG. 19 shows a housing having a lid.

Exemplary sleeves are shown in FIGS. 11-13. A sleeve (30) can have a plurality of grooves (31). In each groove, there is a second scanning component (35) such as a light emitter or a transmission processor as disclosed herein. The grooves have vertical slits (32) allowing light to pass through. The sleeve (30) can be placed around the bottle holder (20) inside the housing (10) as shown in FIGS. 14 and 15. In use, each second light scanning component (35) mounted to the sleeve (30) is aligned with one of the first light scanning components (25) disposed in the recesses (22) of the bottle holder (20). The scanning components can be connected by wiring. The digital water drop and interface data can be recorded and transmitted via the transmission processors such as Lume/Turbiscan readers that are mounted in place for each sample bottle. The sleeve is easily removable when no longer needed.

As shown in FIGS. 16-19, a lid (40) can latch onto the housing (10) to hold test bottles in place during testing. In an embodiment, the lid has raised sections (42) such as cushions pads underneath to compress the test bottles securely in place. The lid (40) can also have apertures (41) for mounting an extraction unit and/or for cannulas to pass through. The apertures (41) can go through the raised sections (42) of the lid.

Figure 20:
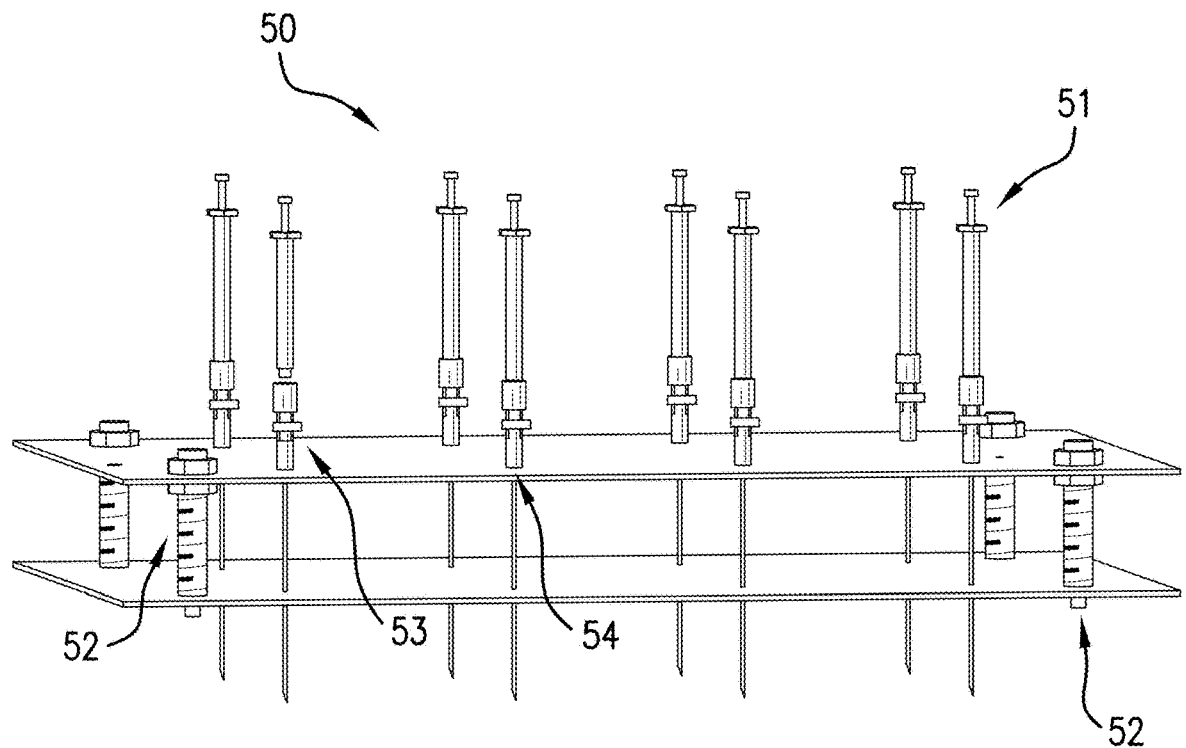
FIG. 20 illustrates an exemplary extraction unit.
Figure 21:
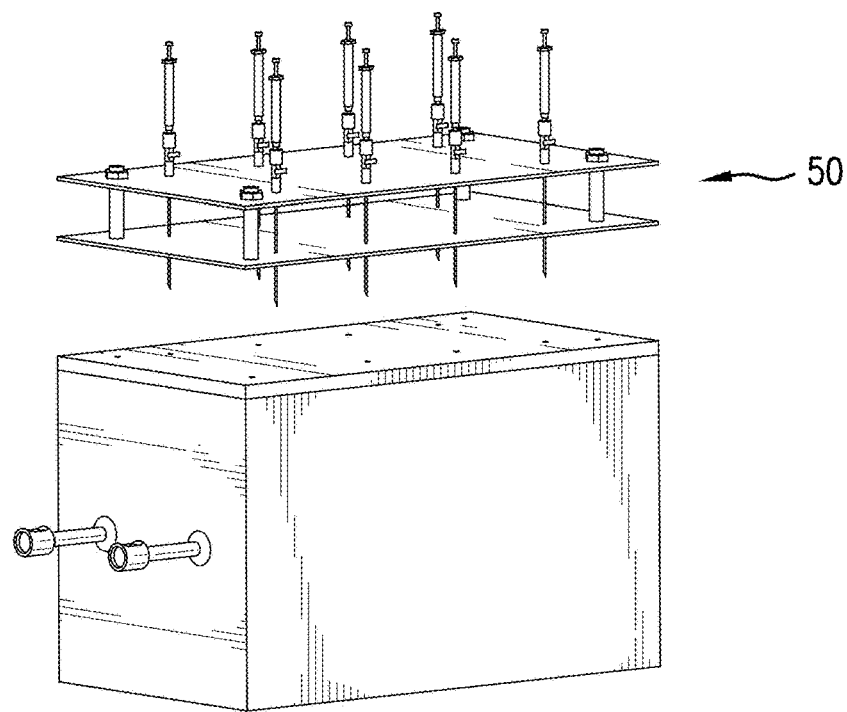
FIG. 21 illustrates a process of mounting an extraction unit on a lid.
Figure 22:
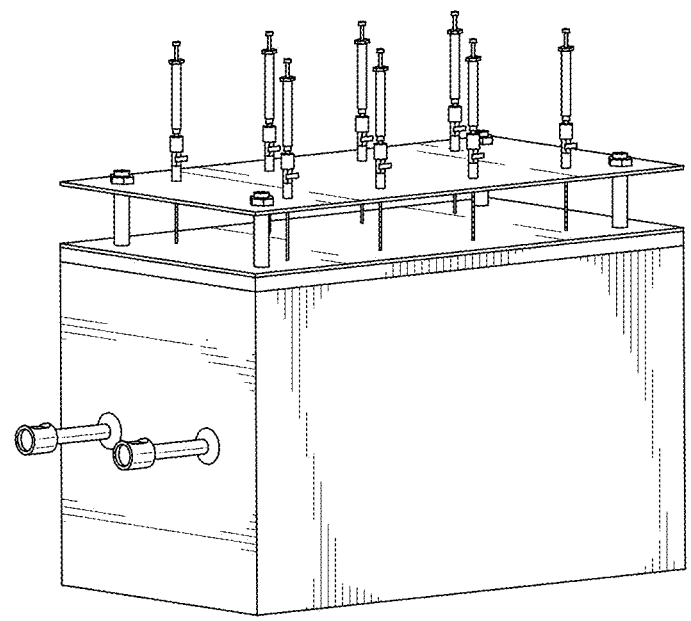
FIG. 22 shows a system having an extraction unit mounted on a lid.
Figure 23:
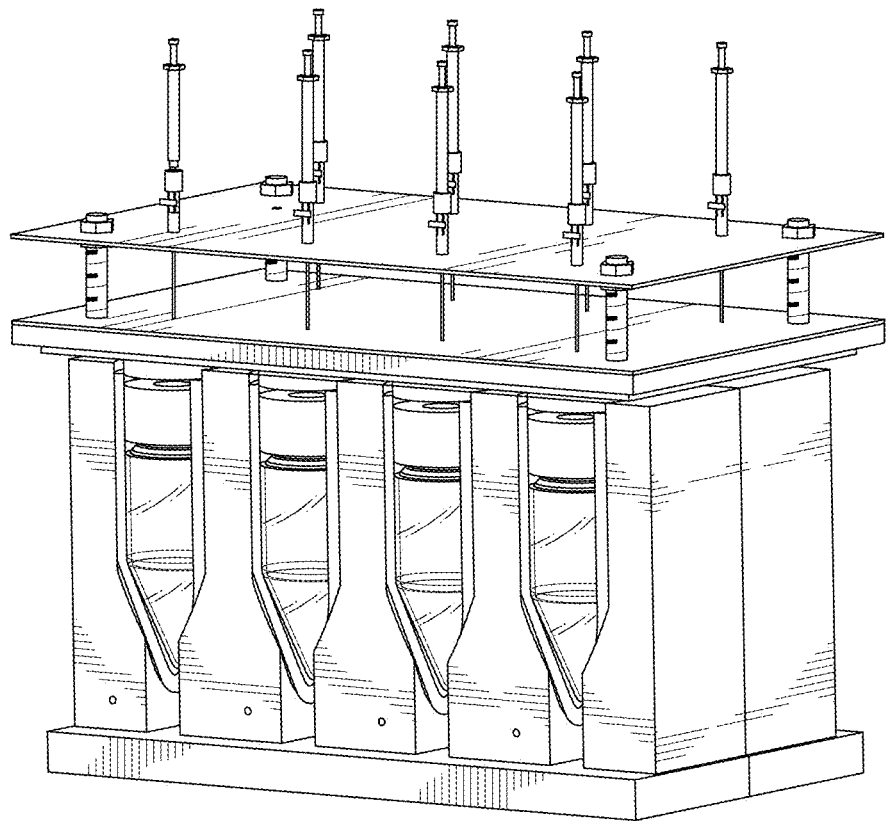
FIG. 23 illustrates a process of collecting samples from test bottles using an extraction unit.

An example of extraction unit (50) is illustrated in FIG. 20. The extraction unit (50) has an array of cannulas (54), which can have fixed volumes. The heights of the cannulas can be adjusted quickly using the threaded bolts (52) on the corners. With the fixed cannulas, samples can be collected at a consistent extraction level. Each cannula has a pressure containment valve (53) coupled to it to prevent unintended pressure release from sample bottles during sample collection. The extraction unit (50) also has disposable syringes (51) connected to cannulas (54). The syringes can hold the extracted samples. As shown in FIGS. 21-23, the extraction unit (50) can be placed on the lid (40) and driven into the sample bottles which can optionally have septum lids.

Figure 24:
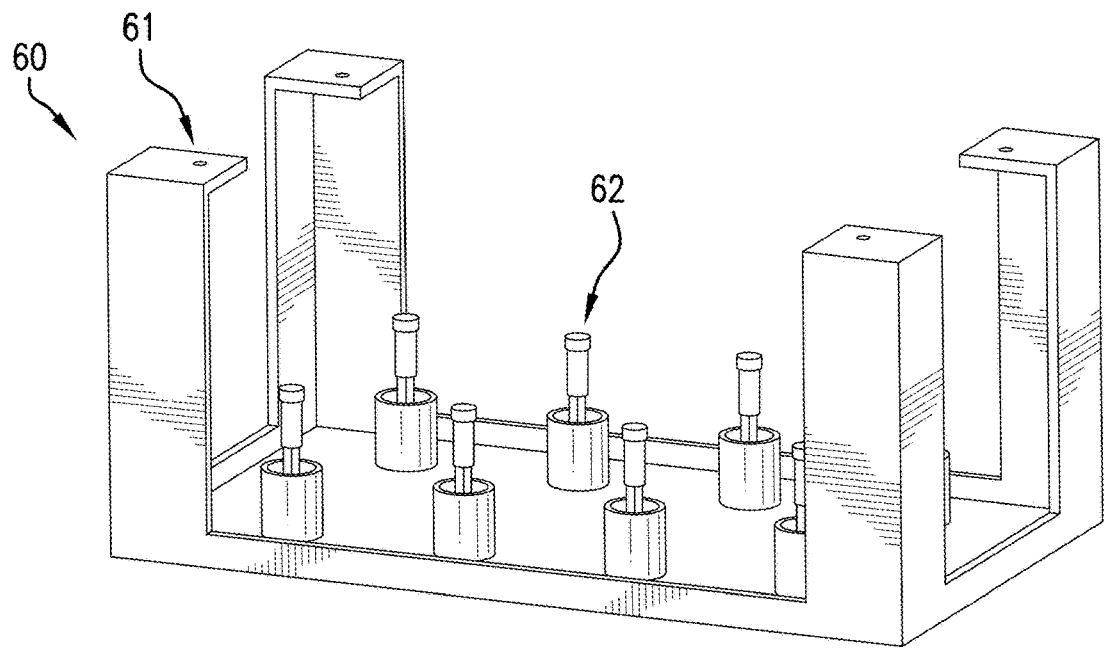
FIG. 24 shows an exemplary centrifuge test tube holder.
Figure 25:
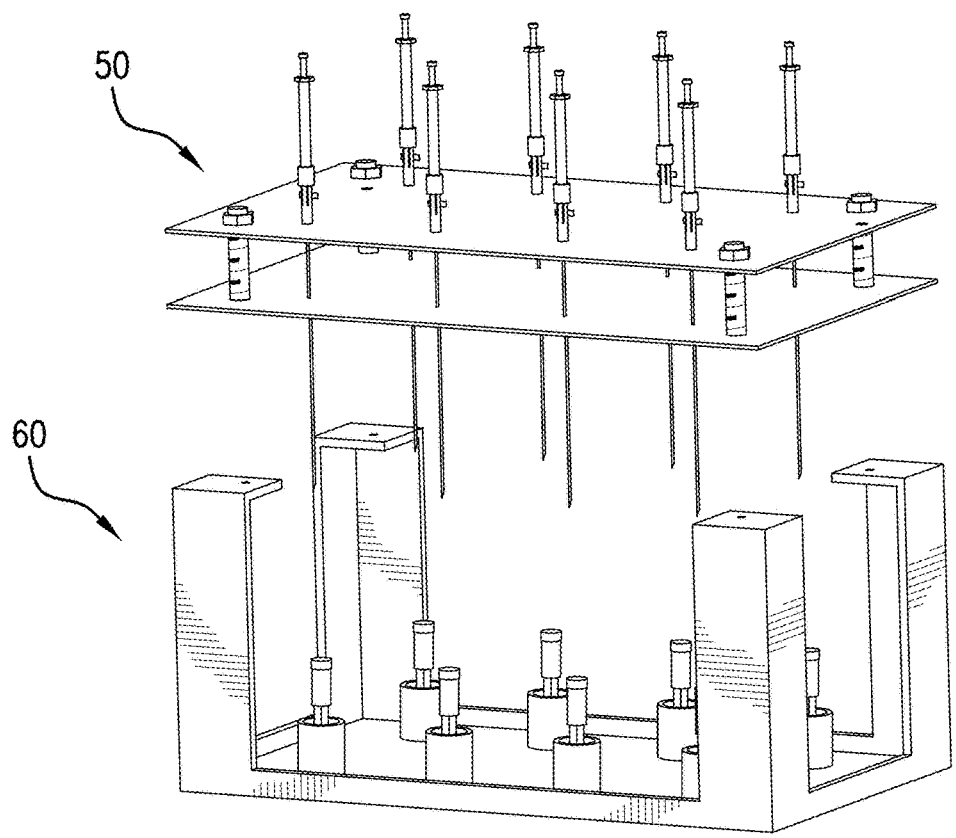
FIG. 25 illustrates a process of positioning an extraction unit on the centrifuge test tube holder.
Figure 26:
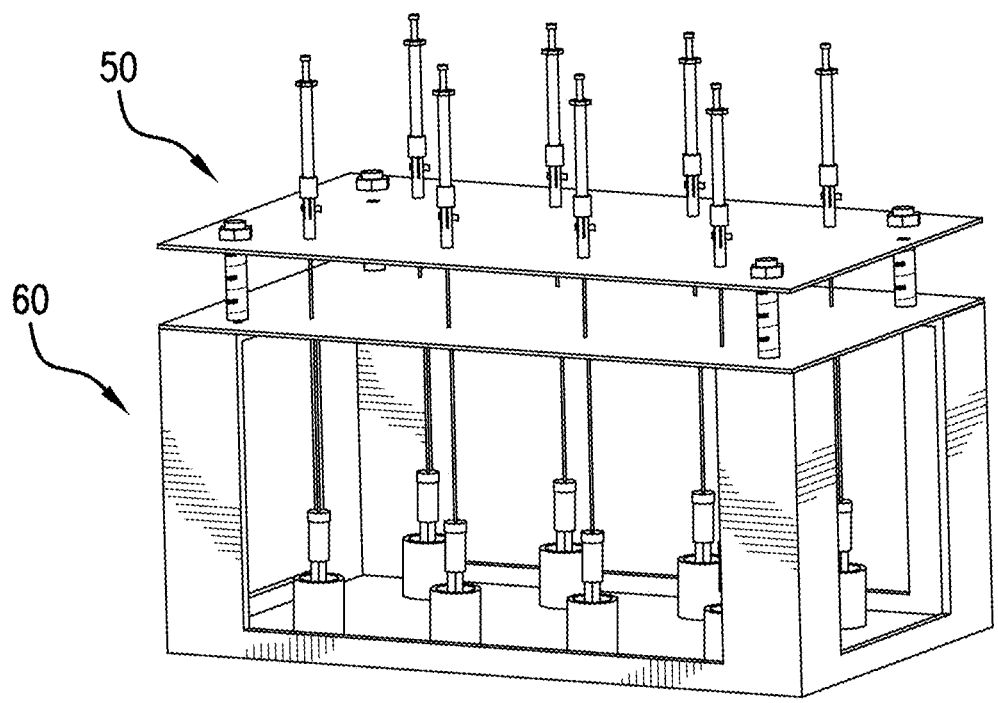
FIG. 26 illustrates a process of transferring samples collected from an extraction unit to centrifuge test tubes.

After samples have been extracted from the test bottles, the extraction unit (50) is lifted off the lid and placed on a centrifuge test tube holder. An exemplary centrifuge test tube holder (60) is shown in FIG. 24. The centrifuge test tube holder includes mounts (61) for the extraction unit and centrifuge test tubes (62). Each extracted sample can be transferred to the centrifuge test tubes (62) as shown in FIGS. 25 and 26. The transferred samples are then centrifuged to collect the final water cut data.

In an embodiment, additive manufacturing methods are used to make one or more components of the system. Other known methods may also be used. The materials used and the design files may be altered or changed based on trials with the prototype.

Figure 27:
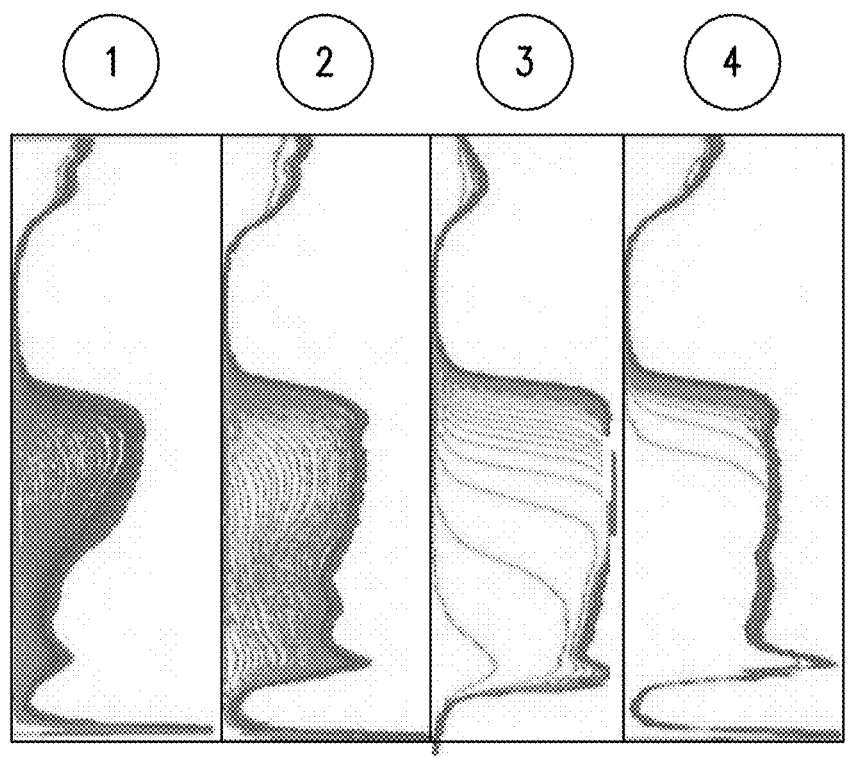
FIG. 27 illustrates the phase separation information obtained from a transmission processor for the samples contained in different test bottles.
Figure 28:
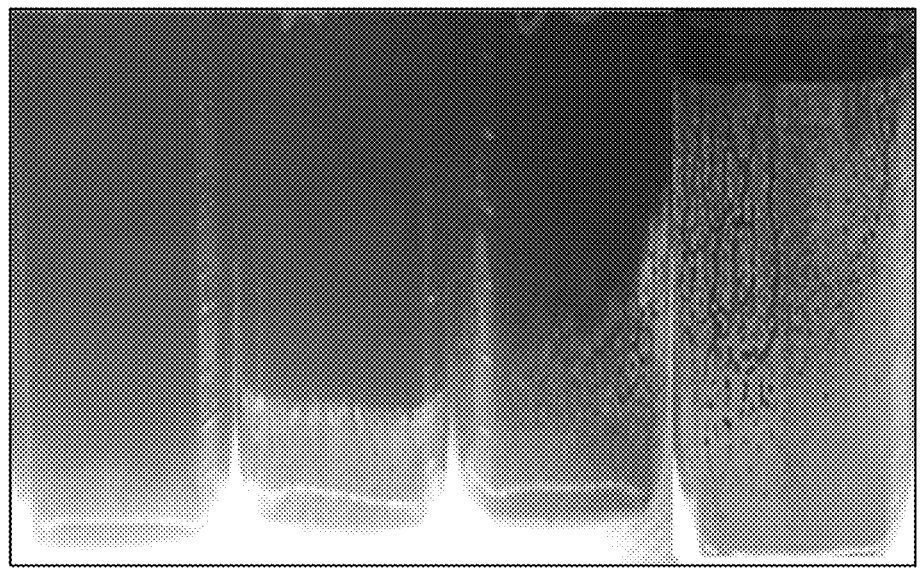
FIG. 28 shows the phase separation of emulsions in different test bottles.
Figure 29:
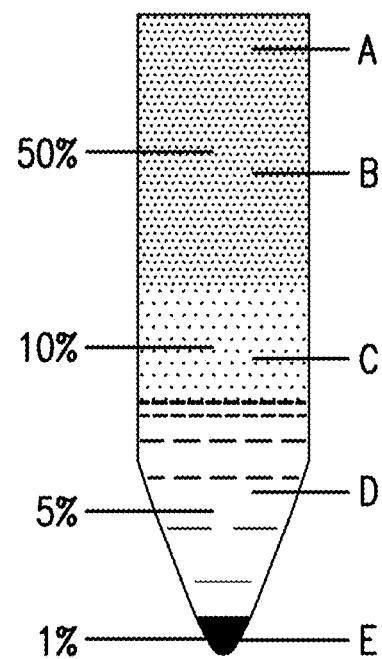
FIG. 29 illustrates an exemplary emulsion after treated with a demulsifier.
Figure 30:
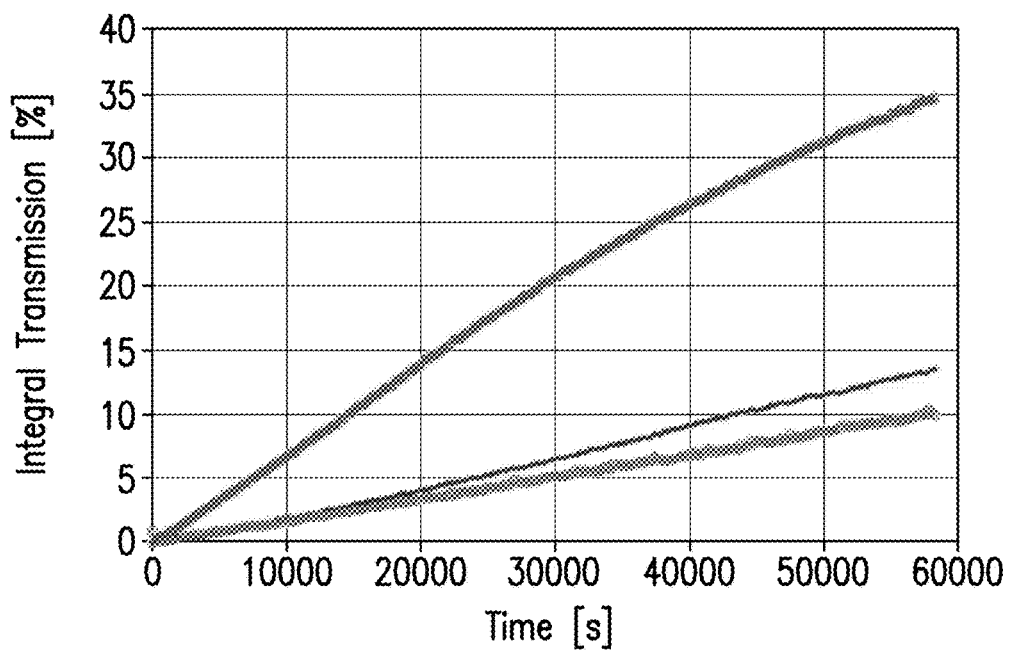
FIG. 30 shows water drop information for the tested samples illustrated as integral transmission (%) as a function of time.
Figure 31:
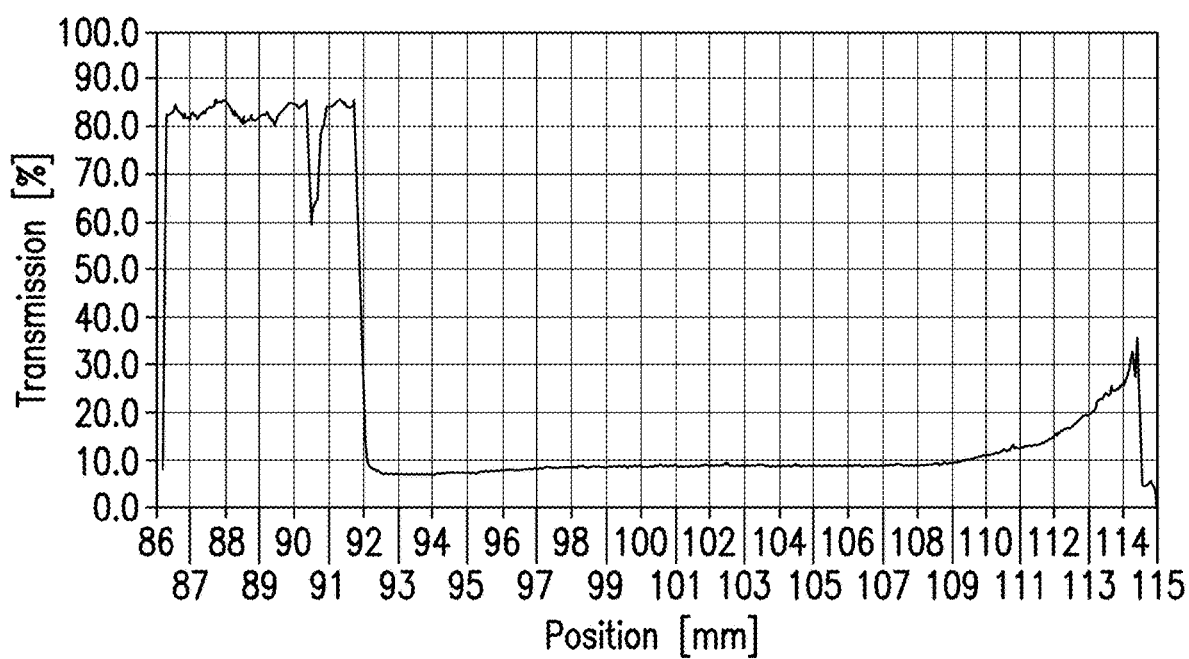
FIG. 31 illustrates basic sediment and water information (BS&W) determined using a system as disclosed herein.

During the testing, bottles filled with a control emulsion without demulsifiers or a test emulsion that includes demulsifiers are placed in the bottle holder. The oil/water separation information can be read and recorded manually when there are backlights such as LED lights in the recesses of the bottle holder. Alternatively real-time digital data can be provided automatically via the first and/or the second scanning component using automated light scanning technology. The method can further include extracting a sample from each of the test bottles; transferring the collected samples to test tubes; and centrifuging the samples in the test tubes to obtain water cut information. Exemplary test results are shown in FIGS. 27-31. In particular, FIG. 27 illustrates the information obtained from a transmission processor for samples 1 to 4 in different test bottles. FIG. 28 shows the phase separation of emulsions in different test bottles. FIG. 29 illustrates an exemplary emulsion after treated h a demulsifier wherein the emulsion contains about 50 vol % of a blend of top oil A and dehydrated "dry" crude oil B, about 10 vol % of interface C, about 5 vol % of water, and about 1 vol % of solids such as FeS and sand. FIG. 30 shows the water drop information for the tested samples illustrated with integral transmission (%) as a function of time, and FIG. 31 illustrates basic sediment and water information (BS&W) determined using a system as disclosed herein.

Set forth below are various embodiments of the disclosure.

Embodiment 1

A system for monitoring phase separation, the system comprising: a temperature control housing having an inlet and an outlet for fluid circulation; a bottle holder positioned inside the housing, the bottle holder having a body with a plurality of recesses for receiving test bottles, each recess having a back surface, a front opening, and a first light scanning component mounted on the back surface of the recess; a sleeve having a plurality of second light scanning components mounted thereon, the sleeve being disposed between the housing and the bottle holder, and each second light scanning component being aligned with one of the first light scanning components; and a lid disposed on the housing to hold the test bottles in place during testing.

Embodiment 2

The system as in any prior embodiment, wherein the first light scanning component is a light emitter and the second light scanning component is a transmission processor, and the first and second light scanning components together are configured to provide phase separation information for samples in the test bottles.

Embodiment 3

The system as in any prior embodiment, wherein the first light scanning component is a transmission processor and the second light scanning component is a light emitter, and the first and second light scanning components together are configured to provide phase separation information for samples in the test bottles.

Embodiment 4

The system as in any prior embodiment further comprising light-emitting diode (LED) lights disposed in the plurality of recesses.

Embodiment 5

The system as in any prior embodiment, wherein each of the plurality of recess has a heating mantle liner disposed therein.

Embodiment 6

The system as in any prior embodiment, wherein the bottle holder has two parts hinged together.

Embodiment 7

The system as in any prior embodiment, further comprising a circulator coupled to the inlet and outlet of the housing; wherein the circulator is effective to circulate a fluid to provide a predetermined temperature environment to the test bottles.

Embodiment 8

The system as in any prior embodiment, wherein the sleeve has a plurality of grooves to hold the second light scanning components.

Embodiment 9

The system as in any prior embodiment, wherein the grooves have vertical slits allowing light to pass through.

Embodiment 10

The system as in any prior embodiment, wherein the lid has a plurality of cushioning pads configured to compress the test bottles in place.

Embodiment 11

The system as in any prior embodiment, further comprising an extraction unit that is configured to collect a sample from each of the test bottles.

Embodiment 12

The system as in any prior embodiment, wherein the extraction unit has an array of cannulas.

Embodiment 13

The system as in any prior embodiment, wherein the extraction unit has a pressure containment valve and syringes coupled to each of the array of cannulas.

Embodiment 14

The system as in any prior embodiment, wherein the lid has a plurality of apertures for mounting the extraction unit and for the array of cannulas to pass through.

Embodiment 15

The system as in any prior embodiment, further comprising a centrifuge test tube holder.

Embodiment 16

The system as in any prior embodiment, where the centrifuge test tube holder has a plurality of centrifuge test tubes aligned with the array of cannulas of the extraction unit to transfer the collected samples from the extraction unit to the centrifuge test tubes.

Embodiment 17

A method of evaluating demulsifiers for breaking an emulsion using the system of claim 1, the method comprising: disposing test bottles in the plurality of recesses of the bottle holder, the test bottles containing a control emulsion or a test emulsion, the test emulsion including an emulsion to be broken and a demulsifier; and recording oil/water separation information using the first or second light scanning component.

Embodiment 18

The method as in any prior embodiment, further comprising extracting a sample from each of the test bottles; transferring the collected samples to the test tubes, and centrifuging the samples in the test tubes to obtain water cut information.

All ranges disclosed herein are inclusive of the endpoints, and the endpoints are independently combinable with each other. As used herein, "combination" is inclusive of blends, mixtures, alloys, reaction products, and the like. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." The modifier "about" used in connection with a quantity is inclusive of the stated value and has the meaning dictated by the context (e.g., it includes the degree of error associated with measurement of the particular quantity).

What is claimed is:
1. A system for monitoring phase separation, the system comprising:
   a temperature control housing having an inlet and an outlet for fluid circulation;
   a bottle holder positioned inside the housing, the bottle holder having a body with a plurality of recesses for receiving test bottles, each recess having a back sur- face, a front opening, and a first light scanning component mounted on the back surface of the recess;

a sleeve having a plurality of second light scanning components mounted thereon, the sleeve being disposed between the housing and the bottle holder, and each second light scanning component being aligned with one of the first light scanning components; and a lid disposed on the housing to hold the test bottles in place.

2. The system of claim 1, wherein the first light scanning component is a light emitter and the second light scanning component is a transmission processor, and the first and second light scanning components together are configured to provide phase separation information for samples in the test bottles.

3. The system of claim 1, wherein the first light scanning component is a transmission processor and the second light scanning component is a light emitter, and the first and second light scanning components together are configured to provide phase separation information for samples in the test bottles.

4. The system of claim 1 further comprising light-emitting diode (LED) lights disposed in the plurality of recesses.

5. The system of claim 1, wherein each of the plurality of recesses has a heating mantle liner disposed therein.

6. The system of claim 1, wherein the bottle holder has two parts hinged together.

7. The system of claim 1, further comprising a circulator coupled to the inlet and the outlet of the housing; wherein the circulator is effective to circulate a fluid to provide a predetermined temperature environment to the test bottles.

8. The system of claim 1, wherein the sleeve has a plurality of grooves to hold the second light scanning components.

9. The system of claim 8, wherein the grooves have vertical slits allowing light to pass through.

10. The system of claim 1, wherein the lid has a plurality of cushioning pads configured to compress the test bottles in place.

11. The system of claim 1, further comprising an extraction unit that is configured to collect a sample from each of the test bottles.

12. The system of claim 11, wherein the extraction unit has an array of cannulas.

13. The system of claim 12, wherein the extraction unit has a pressure containment valve and syringes coupled to the array of cannulas.

14. The system of claim 12, wherein the lid has a plurality of apertures for mounting the extraction unit and for the array of cannulas to pass through.

15. The system of claim 11, further comprising a centrifuge test tube holder.

16. The system of claim 15, where the centrifuge test tube holder has a plurality of centrifuge test tubes aligned with the array of cannulas of the extraction unit to transfer the collected samples from the extraction unit to the centrifuge test tubes.

17. A method of evaluating demulsifiers for breaking an emulsion using the system of claim 1, the method comprising:

disposing the test bottles in the plurality of recesses of the bottle holder, the test bottles containing a control emulsion or a test emulsion, the test emulsion including an emulsion to be broken and a demulsifier; and recording oil/water separation information using the first or second scanning component.

18. The method of claim 17, further comprising extracting a sample from each of the test bottles; transferring the extracted samples to test tubes, and centrifuging the samples in the test tubes to obtain water cut information.

19. The system of claim 1, wherein the lid holds the test bottles in place during operation of the system.

\* \* \* \* \*